(12) United States Patent
Morales

(10) Patent No.: US 6,346,030 B1
(45) Date of Patent: Feb. 12, 2002

(54) MICRODEVICE HAVING INTERIOR CAVITY WITH HIGH ASPECT RATIO SURFACE FEATURES AND ASSOCIATED METHODS OF MANUFACTURE AND USE

(75) Inventor: Alfredo M. Morales, Pleasanton, CA (US)

(73) Assignee: Sandia Corporation, Livermore, CA (US)

( * ) Notice: Subject to any disclaimer, the term of this patent is extended or adjusted under 35 U.S.C. 154(b) by 0 days.

(21) Appl. No.: 09/568,494

(22) Filed: May 9, 2000

(51) Int. Cl.[7] .................................................. B24B 1/00
(52) U.S. Cl. .............................. 451/28; 451/41; 451/54; 451/57
(58) Field of Search .............................. 451/28, 41, 54, 451/57, 285, 287; 269/21; 437/226; 438/50, 295

(56) References Cited

U.S. PATENT DOCUMENTS

| | | | | |
|---|---|---|---|---|
| 5,605,489 A | * | 2/1997 | Gale et al. | 451/28 |
| 5,905,007 A | * | 5/1999 | Ho et al. | 430/22 |
| 5,919,548 A | * | 7/1999 | Barron et al. | 428/138 |
| 5,961,767 A | * | 10/1999 | Aksyuk et al. | 156/275.5 |
| 5,976,994 A | * | 11/1999 | Nguyen et al. | 438/295 |
| 6,159,385 A | * | 12/2000 | Yao et al. | 216/2 |
| 6,210,046 B1 | * | 4/2001 | Rogers et al. | 385/74 |
| 6,245,849 B1 | * | 6/2001 | Morales et al. | 524/442 |
| 6,271,802 B1 | * | 8/2001 | Clark et al. | 343/895 |
| 6,277,666 B1 | * | 8/2001 | Hays et al. | 438/50 |

* cited by examiner

Primary Examiner—Derris H. Banks
Assistant Examiner—Hadi Shakeri
(74) Attorney, Agent, or Firm—Louis L. Wu; Reed & Associates

(57) ABSTRACT

A microdevice having interior cavity with high aspect ratio features and ultrasmooth surfaces, and associated method of manufacture and use is described. An LIGA-produced shaped bit is used to contour polish the surface of a sacrificial mandrel. The contoured sacrificial mandrel is subsequently coated with a structural material and the mandrel removed to produce microdevices having micrometer-sized surface features and sub-micrometer RMS surface roughness.

20 Claims, 6 Drawing Sheets

MICRODEVICE HAVING INTERIOR CAVITY WITH HIGH ASPECT RATIO SURFACE FEATURES AND ASSOCIATED METHODS OF MANUFACTURE AND USE

STATEMENT OF GOVERNMENT INTEREST

This invention was made with Government support under Contract DE-AC04-94AL85000 awarded by the U.S. Department of Energy. The Government has certain rights in the invention.

FIELD OF THE INVENTION

The present invention relates generally to three-dimensional forms having high aspect ratio features with ultrasmooth surfaces, and to methods for fabricating such forms useful as microdevices. More particularly, the invention relates to such microdevices having an interior cavity with surface features on the order of one micrometer, yet retaining sub-micrometer surface roughness, and to a method for fabricating such microdevices using a precise contour polishing method.

BACKGROUND OF THE INVENTION

Microdevices are microelectromechanical systems (MEMS) with overall dimensions on the order of one millimeter and feature sizes on the order of one micrometer. One approach to fabricate such MEMS devices employs LIGA technology (LIGA is an acronym from the German words for lithography, electroplating, and molding). In particular, the LIGA technology can produce precise, high aspect ratio microstructures from engineering materials.

Designs for microdevices call for such things as precision cavities having uniaxial symmetry with micrometer-size features on the interior surface. These microdevices include resonance cavities and bellows. Additional applications include microscopic battlefield recognizance robots, smaller or microscopic spacecrafts, portable medical systems, communication equipment, microfluidic or microanalysis systems, or other microsystem applications.

Some of the techniques currently used for the manufacture of such microdevices involve electric discharge machining (EDM), fusion bonded LIGA parts, and diamond machining. However, these alternative technologies do not offer satisfactory solutions for the microdevice applications described above. EDM and diamond machining yield rough surfaces and LIGA parts limit the geometries available. High aspect ratio processing via EDM, LIGA, diamond machining and other micromachining technologies are generally described in Chapter 6 of the *Handbook of Microlithography, Micromachining, and Microfabrication* (P. Rai Choudbury, ed., SPIE-The International Society for Optical Engineering and The Institute of Electrical Engineers, 1997) and Chapter 7 of *Fundamentals of Microfabrication* (Marc Madou, CRC Press, 1997).

The microdevices claimed in this invention have micrometer-size interior surface features and sub-micrometer RMS surface roughness. The method claimed is cheaper, faster, and produces much better devices than alternative micromachining technologies. The inventive method uses photolithography to produce a shaped bit, contour polishing to produce a contoured sacrificial mandrel, subsequent coating of the mandrel with a structural material, and removal of the mandrel to produce the microdevice. Contour polishing is to be distinguished from microcutting techniques, which are not generally capable of producing such fine features and surface smoothness.

U.S. Pat. No 5,236,572 discloses a method for forming inkjet orifice plates comprising electroforming a metal layer on the surface of a reusable mandrel, such as a movable belt or rotating drum, having a microfabrication pattern and subsequently separating the metal layer from the mandrel surface. The continuous electroforming process of this patent is capable of forming a metal surface with details that a micrometer-sized in dimension, but not on the interior surface of a microdevice.

U.S. Pat. No. 5,772,903 discloses a process for making tapered capillary optics comprising producing an etched metal or glass wire mandrel having extremely low surface roughness, coating the wire mandrel with a chosen material, and removing the wire mandrel by chemical etching. Such a process can produce a microdevice having an interior cavity with an ultrasmooth bore, but it is not capable of producing precise contoured features on surface of the bore.

SUMMARY OF THE INVENTION

The present invention relates generally to three-dimensional forms having high aspect ratio features with ultrasmooth surfaces, and to methods for fabricating such forms useful as microdevices. More particularly, the invention relates to microdevices having an interior cavity with surface features on the order of one micrometer, yet retaining sub-micrometer surface roughness, and to a method for fabricating such microdevices using a precise contour polishing method.

To produce such a microdevice requires the preparation of a sacrificial mandrel that has the precise surface contour to be replicated in the microdevice itself. This mandrel must have a replicating surface that is substantially free of roughness, on a scale of about one micrometer RMS or less, and has the desired surface contour. A convenient mandrel material is a plastic, such as polymethylmethacrylate (PMMA), that can be easily polished and readily removed from the structural material that forms the microdevice.

To produce a contoured surface having precise high aspect ratio features requires a shaped bit having features of similar dimension. A shaped bit allows for the generation of complex geometries in one operation as opposed to traditional cutting where the cutting tool must make serial cuts. Cutting tools also require higher maintenance - a sharpened cutting edge must be whet and kept from dulling. In one embodiment of this invention, a method for making such a shaped bit is the LIGA process, which has been demonstrated to be capable of producing precise, high aspect ratio microstructures of suitable bit materials. LIGA bits are used because their thickness keeps them from being elastically or plastically deformed.

The sacrificial mandrel is contoured by slowly advancing the shaped bit into the rotating sacrificial mandrel that is mounted in a precision turning machine, such as a precision lathe, and whose surface has been prepared with a suitable polishing compound. The contouring is preferably accomplished by polishing but may also be accomplished by cutting under limited circumstances. However, cutting tends to leave an undesirably rough surface.

The structural material can be applied to the mandrel by electroplating or by other methods known to those of skill in the art, such as vapor deposition or plasma spraying.

Where the mandrel material is nonconductive and electroplating produces the structural material, it is generally necessary to first apply an electrically conductive precursor coating to the surface of the mandrel. If the structural material is applied to a thickness in excess of the final thickness, the external surface can be machined to its final shape. The mandrel is subsequently removed by degradation, dissolution, leaching, vaporization, or other removal process that does not attack the structural material itself.

BRIEF DESCRIPTION OF THE DRAWINGS

The accompanying drawings, which are incorporated in and form part of the specification, illustrate the present invention and, together with the description, explain the invention. In the drawings like elements are referred to by like numbers. All figures illustrate aspects of the invention in cross-sectional schematic view.

FIG. 1 illustrates a LIGA-shaped bit having a polishing surface that exhibits a desired contour. FIG. 2 illustrates a pre-contoured sacrificial mandrel in the shape of a cylindrical rod that has been surface coated with a polishing compound. FIG. 3 illustrates a contoured sacrificial mandrel made from polishing the sacrificial rod of the FIG. 2 using the LIGA-shaped bit of FIG. 1.

FIG. 4 illustrates the contoured sacrificial mandrel of FIG. 3 that has been coated with a thin conductive plating base. FIG. 5 illustrates the coated mandrel of FIG. 4 with additional plated structural material and a machined outer surface. FIG. 6 illustrates a microdevice having a contoured interior surface defining an axially symmetric cavity in the shape of the contoured sacrificial mandrel of FIG. 3.

FIG. 7 illustrates the sacrificial mandrel of FIG. 3 with a thin exterior coating of uniform thickness. FIG. 8 illustrates a thin wall microdevice formed by removing the sacrificial mandrel illustrated in FIG. 7.

DETAILED DESCRIPTION OF THE INVENTION

I. Definitions and Overview

Figure 1:
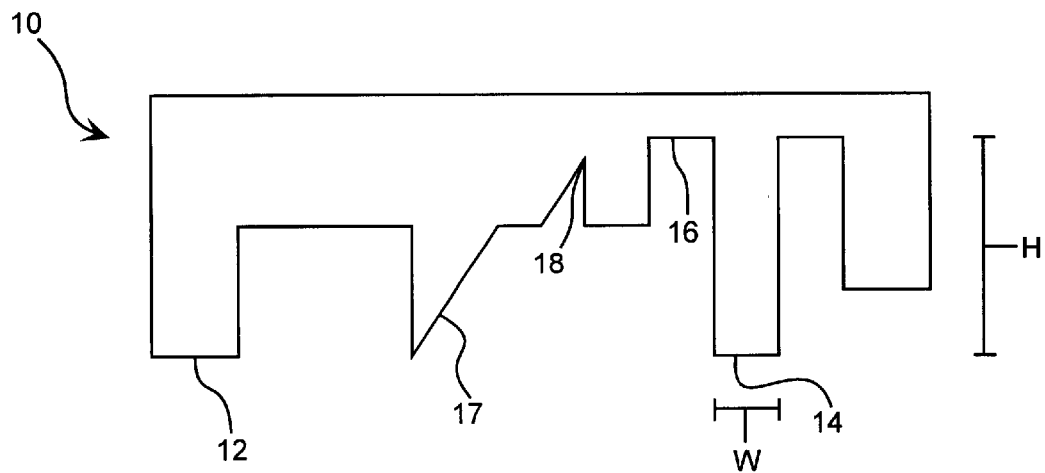
FIGS. 1–3 illustrate a fabrication method for producing a sacrificial mandrel that has precise interior surface contour with high aspect ratio features, the inverse of which are to be replicated in the microdevice.

It is understood that, unless otherwise indicated, this invention is not limited to specific materials (e.g., specific degradable polymers or metals), manufacturing equipment, process conditions, or the like, as such may vary. It is also understood that the terminology used herein is for the purpose of describing particular embodiments only and is not intended to be limiting.

It must be noted that, as used in this specification and the appended claims, the singular forms "a,""an," and "the" include plural referents unless the context clearly dictates otherwise. Thus, for example, reference to a "polymer" includes mixtures of polymers; reference to a "metal" includes mixtures of metals, and the like.

The term "polymer" is used herein in its conventional sense to refer to a compound having two or more monomer units, and is intended to encompass homopolymers as well as copolymers, including, for example, graft polymers. These polymers herein that are referred to as "degradable" or "sacrificial" are polymers capable of being thermally, chemically, and/or photolytically degraded.

The term "feature" refers to a recess in a substrate surface (e.g., an aperture, channel, or the like) or a protrusion on a substrate surface (e.g., a ridge or the like). Features of "micrometer-size" dimension have a height, width (diameter) or length that is on the order of one micrometer or less. The smallest dimension of a micrometer-size feature does not exceed about 10 micrometers and preferably does not exceed one micrometer.

The term "aspect ratio" is used in its conventional sense to refer to the ratio of an object's height to its width (or diameter). High aspect ratio structures may thus be prepared using bits or molds (such as LIGA bits or molds) having protrusions or recesses that are extremely narrow relative to their height. "Optional" or "optionally" as used herein means that the subsequently described feature or structure may or may not be present, or that the subsequently described event or circumstance may or may not occur, and that the description included instances where a particular feature or structure is present and instances where the feature or structure is absent, or instances where the event or circumstance occurs and instances where it does not. For example, an "optional coating" refers to a coating that may or may not be present, "optionally polishing" refers to a polishing step that may or may not be carried out, and the like.

II. Fabrication

Referring to the drawings, the method of fabrication of the embodiments of the microdevice is described hereinafter with respect to FIGS. 1–8, producing a hollow, uniaxial interior surface contoured microdevice, shown in FIG. 6, and a similarly fabricated thin-walled microdevice, shown in FIG. 8. These drawings are not to scale, and, some aspects in particular may be exaggerated for clarity of presentation.

One embodiment of the invention is a microdevice comprising a three-dimensional form having an interior cavity bounded by a contoured interior surface exhibiting axial symmetry about a cavity axis, wherein the interior surface contour comprises at least one micrometer-sized high aspect ratio feature. Such a microdevice may have use, e.g., as a resonance chamber, bellows, or micromold. The following will describe both the microdevice of the invention as well as a method for forming such microdevices.

To prepare the microdevices, a sacrificial mandrel is first produced that has a precise interior surface contour with high aspect ratio features, the inverse of which are to be replicated in the microdevice. To fabricate the sacrificial mandrel, a contoured bit is provided. The bit is produced using a LIGA process. FIG. 1 shows a shaped bit 10 produced by a LIGA process, having a polishing surface 12 that exhibits a desired contour. As shown, the contour of the polishing surface 12 is formed by a plurality of features such as protrusions 14 and 17 or recesses 16 and 18. As shown, protrusion 14 exhibits a height, H, and width, W and a high aspect ratio of H:W. With LIGA, high aspect ratio microstructures can be created with micrometer-size contour accuracy and sub-micrometer surface finish. In particular, LIGA enables the production of a shaped bit of a suitable bit material, such as a metal or ceramic, and having vertical dimensions of hundreds of micrometers to millimeters and horizontal dimensions as small as several micrometers. Aspect ratios achievable by the LIGA process are typically about 10:1 to 100:1, although aspect ratios such as 1:1 and 500:1 are not unknown. Other microfabrication techniques, such as surface micromachining of polysilicon, produce microparts usually one to two microns in thickness that are prone to elastic or plastic deformation, and are typically not suitable for producing the above bit.

Figure 2:
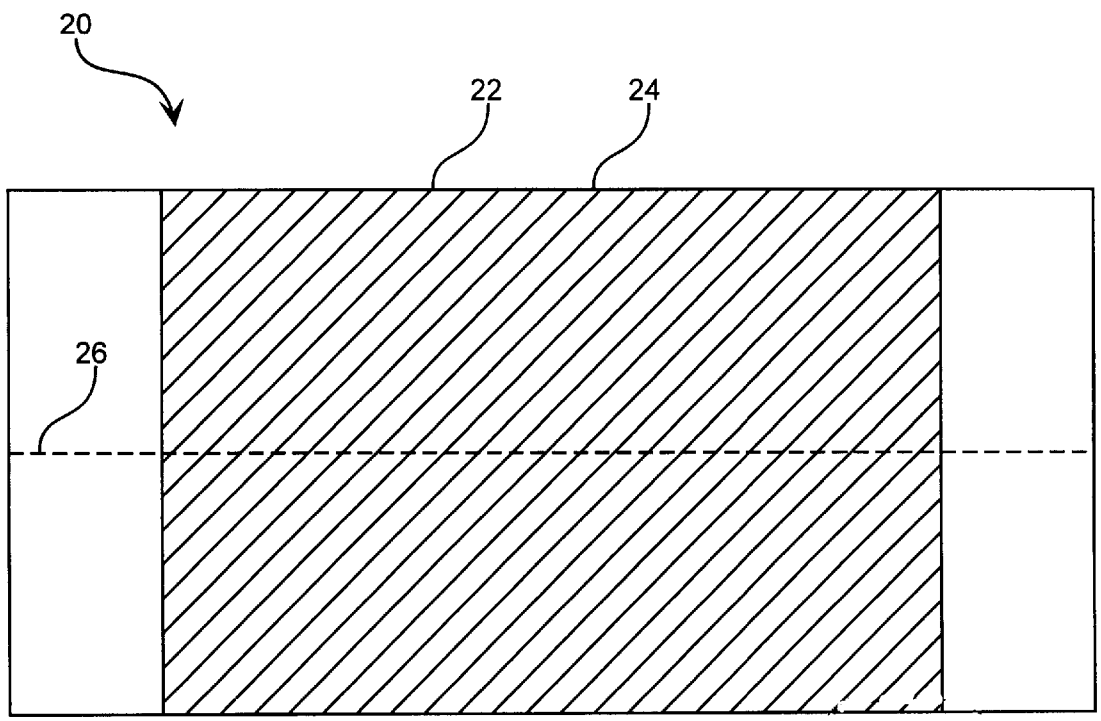

In addition, a sacrificial mandrel is mounted and rotated in a precision turning machine. FIG. 2 shows a cylindrical rod 20 as the sacrificial mandrel. The rod 20 is rotated about its axis 26. While the mandrel may be initially of any shape, it is preferred that the mandrel initially exhibits substantially axial symmetry. Optimally, the mandrel is a three-dimensional solid form, such as a cylinder (as shown), cone, sphere, or ellipsoid that exhibits perfect axial symmetry. When the mandrel exhibits axial symmetry, the mandrel is preferably rotated about its axis. The mandrel material must be capable of being contour polished by the shaped bit and be selectively degradable or otherwise removable relative to the microdevice structural material itself. In this embodiment, wherein the microdevice structural material is an electroformed metal, a suitable mandrel material is PMMA, which is soluble in organic solvents that do not attack the metal. Depending on the application, removal technique, and structural material, other mandrel materials include, but are not limited to, polymeric materials other than PMMA, metals, low melting temperature materials, glasses, ceramics, and the like that are suitable for abrasive shaping and fluidizing as discussed infra.

Before or during the rotation of the mandrel, the surface 22 of the mandrel 20 is coated with a suitable polishing compound 24. Typically, the polishing compound comprises a lubricating component and solid polishing particles that remove material from the mandrel through mechanical abrasion. Optionally, the polishing compound may included an etching component to assist in the chemical removal of the mandrel material. For the PMMA mandrel, a suitable polishing compound comprises Putz Pomenade (made by Burnishine Products) and WD-40 in an approximately 50/50 mixture by volume. Depending on the application, the particle size of the polishing compound should be less than 100 micrometers and, preferably, below 10 micrometers. Polishing compounds having a particle size of about 10 nanometers are known in the art.

Once the mandrel is rotated, the mandrel is coutour polished with the shaped bit. As an example of a typical contouring operation, the shaped bit is mounted on a tool holder and attached to the cutting bit holder of a precision lathe. While the mandrel is rotated at about 220 rpm, the polishing surface 12 of the bit 10 is slowly brought into contact with the surface 22 of the rod 20 that has been coated with polishing compound 24. The bit is made to polish the surface of the PMMA rod by slowly advancing the bit into the PMMA at a rate of 0.5 micrometers every 10 seconds. The desired contouring mechanism is primarily via polishing, and optionally cutting. The resulting contoured sacrificial mandrel 20 replicates the contour of the polishing surface of the bit with a surface roughness of less than one micrometer RMS. It is important to note that surface roughness and material removal rate are generally a function of the polishing surface of the bit and the particle size of the polishing compound. Larger polishing particles tend to remove material at a faster rate while smaller polishing particles generally result in a smoother final surface. Thus, for example, using polishing particles of about 10 nm in size may result in a surface smoothness of about 10 nm RMS, using particles of 100 nm may results in a surface smoothness of about 100 nm RMS, and using particles of 500 nm may result in a surface smoothness of about 500 nm RMS. Moreover, polishing may be carried out in sequential steps such that larger polishing particles are used to facilitate fast removal of material and smaller polishing particles are used to provide a smooth final surface. The bit is preferably made from a harder material than the polishing compound so as to avoid bit wear that may compromise the tolerance of the finished mandrel. In addition, the polishing compound material should be at least as hard as the mandrel material. Furthermore, a properly shaped bit may also be advanced in a lateral direction, along the rotational axis of the lathe, to produce undercut surface features.

It is understood that the mandrel configuration is not limited to the uniaxial, cylindrical geometry produced by a precision lathe. Other geometries, such as planar, are possible with other types of tools and turning machines, such as a milling machine, the essential feature being the polishing of the mandrel with a lithographically fabricated bit. In addition, the mandrel may be reshaped subsequent to polishing by bending, stretching, or other deformation techniques to form nonsymmetric microstructures.

Figure 3:
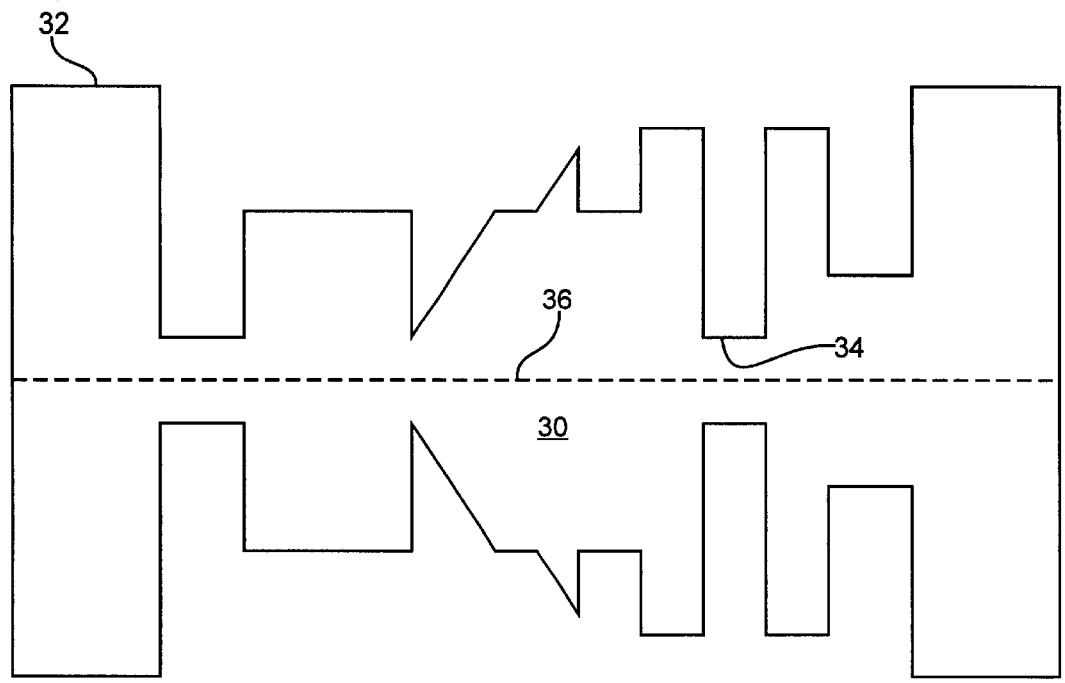

Once polishing is completed, any remaining polishing compound is removed from the sacrificial mandrel is ready to be coated. FIG. 3 shows a contoured sacrificial mandrel 30 made from a PMMA rod that was mounted in a precision lathe and contour polished with a shaped LIGA bit 10. As shown, surface 21 of the contoured mandrel 30 is the inverse of the contour of the polishing surface 12 of bit 10. For example, recess 34 of the contoured mandrel 30 corresponds to protrusion 14 of the bit 10.

Since the dimensions of the mandrel will correspond to the dimensions of the interior cavity of the microdevice to be formed, the dimensions of the mandrel must be adapted to conform to the final use of the microdevice. For example, if the microdevice is to be used as a resonance chamber, the dimensions and the location of the features of the mandrel must be appropriate for the desired resonance waveform. As another example, if the microdevice is to be used as a bellows, the features of the mandrel must be such that the resulting bellows is appropriately sized in both the extended or collapsed position.

Figure 4:
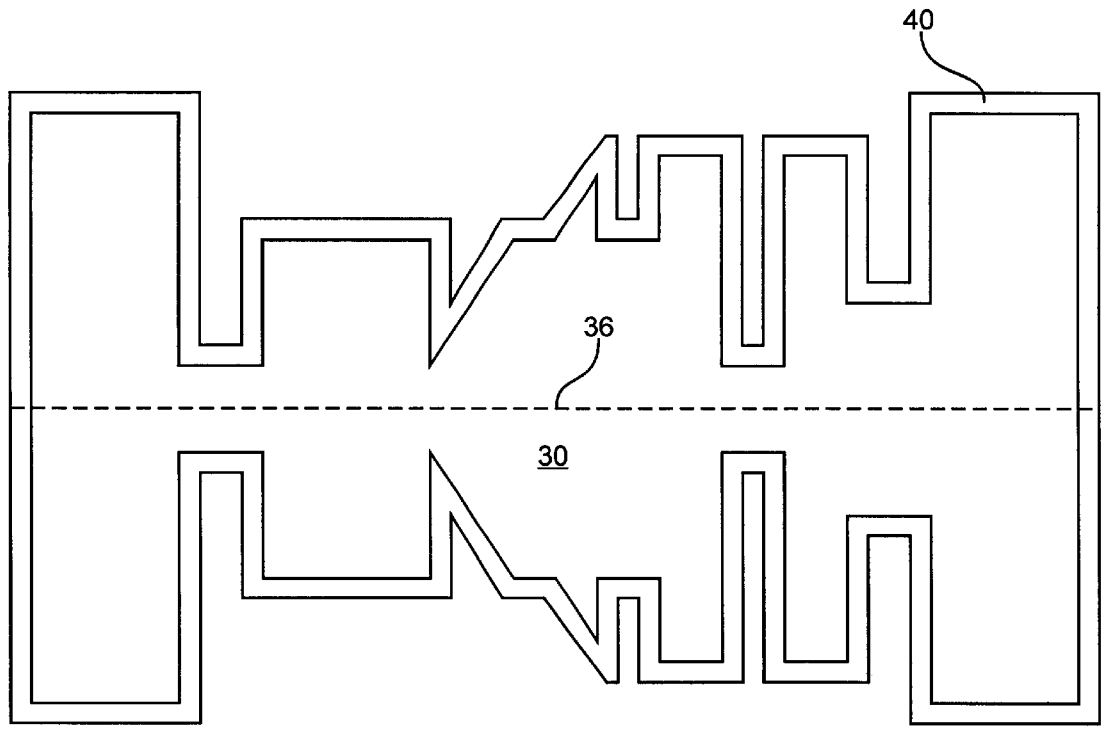
FIGS. 4–6 show the production of a hollow microdevice with high aspect ratio interior surface features using the sacrificial mandrel shown in FIG. 3.

Once the polishing compound 24 is removed from the contoured mandrel 30, the mandrel coated with a conformal coating of the desired microdevice structural material. In a typical application, this structural material is electroformed onto the mandrel. Electroplating in particular provides a quick and efficient means of forming the coating. However, when a nonconductive mandrel is employed, a thin conducting layer is required as a precursor plating base onto which a thick, electroplated structural material can be deposited. As illustrated in FIG. 4, a conducting layer 40 is deposited onto the contoured PMMA sacrificial mandrel 30. In the preferred embodiment, the conducting layer is formed by coating the contoured sacrificial PMMA mandrel with about 100 angstroms of chromium followed by depositing 1000 angstroms of copper by thermal evaporation in vacuum. Other thin film deposition techniques, such as electron-beam or thermal evaporation, plasma spraying, or sputtering, may also be used.

Figure 5:
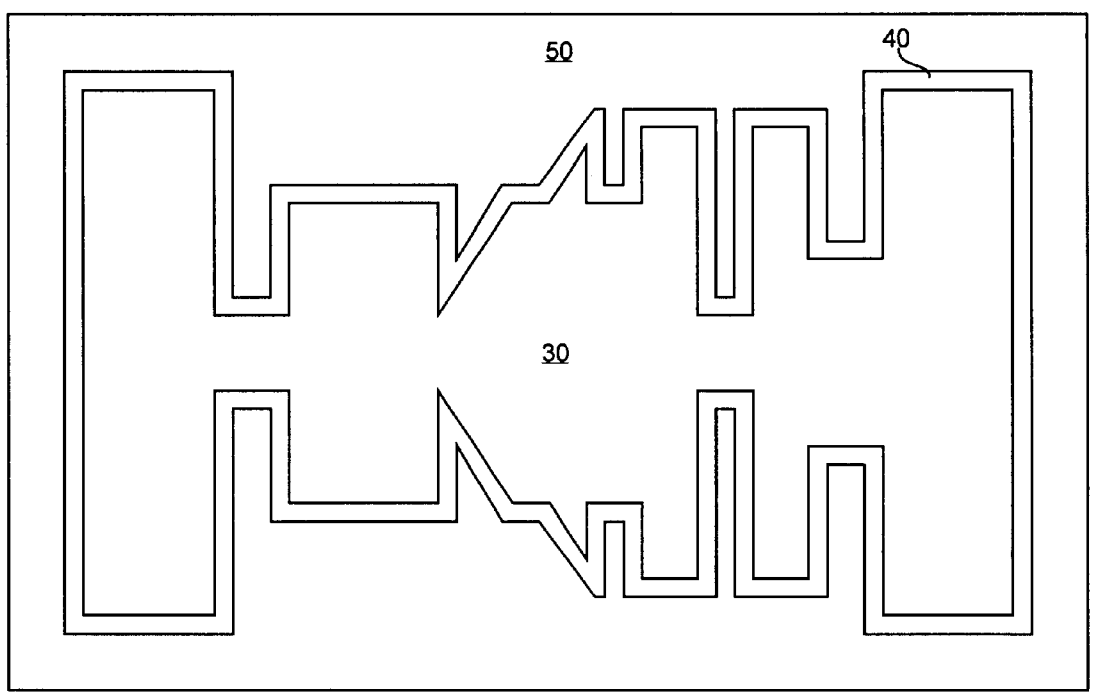

A structural material, such as nickel, may be electroplated to the final thickness around the PMMA mandrel. The thickness of the structural material may be uniform or varied by masking, local variation of the plating rate, or other methods to differentially control the plating thickness. Alternatively, the electroplating may produce a thicker-than-desired coating and the outer surface of the microdevice and the ends can be machined to the final external shape and dimension using standard techniques, such as turning, milling, or polishing. FIG. 5 illustrates the mandrel of FIG. 4 that has been electroplated with a thicker coating 50 of structural material, which, in turn, has an outer surface that has been machined.

Finally, the sacrificial mandrel is removed. Removal may be facilitated by ensuring that access to the sacrificial mandrel is provided, i.e., the structural material does not completely encase the mandrel. If the structural material is nickel, the PMMA mandrel can be dissolved out using acetone or other suitable organic solvent. Mandrel dissolution produces the microdevice 60 of the invention, shown in FIG. 6, having a contoured interior surface 62 defining a cavity 64 that is symmetric about axis 36 and that is in the shape of the contoured sacrificial mandrel 30 of FIG. 3. As shown, protruding annular ridge 66 corresponds to recess 34 of the contoured sacrificial mandrel 30. In general, removal of the sacrificial mandrel involves inducing at least a portion of the sacrificial mandrel to undergo a phase change without disturbing the structural material that form the microdevice. Such a phase change usually involves fluidizing the mandrel in whole or in part. This can be accomplished through inducing the mandrel or a portion thereof to melt, sublime, be dissolved or undergo any combination thereof. Once the mandrel is removed, it is evident that a single-piece solid form is produced having a cavity therein, wherein the cavity is in communication with the exterior of the form. Where desirable, a plurality of such single-piece solid forms may be individually assembled prepared and then attached with one another to form a multiple-piece solid form.

Figure 6:
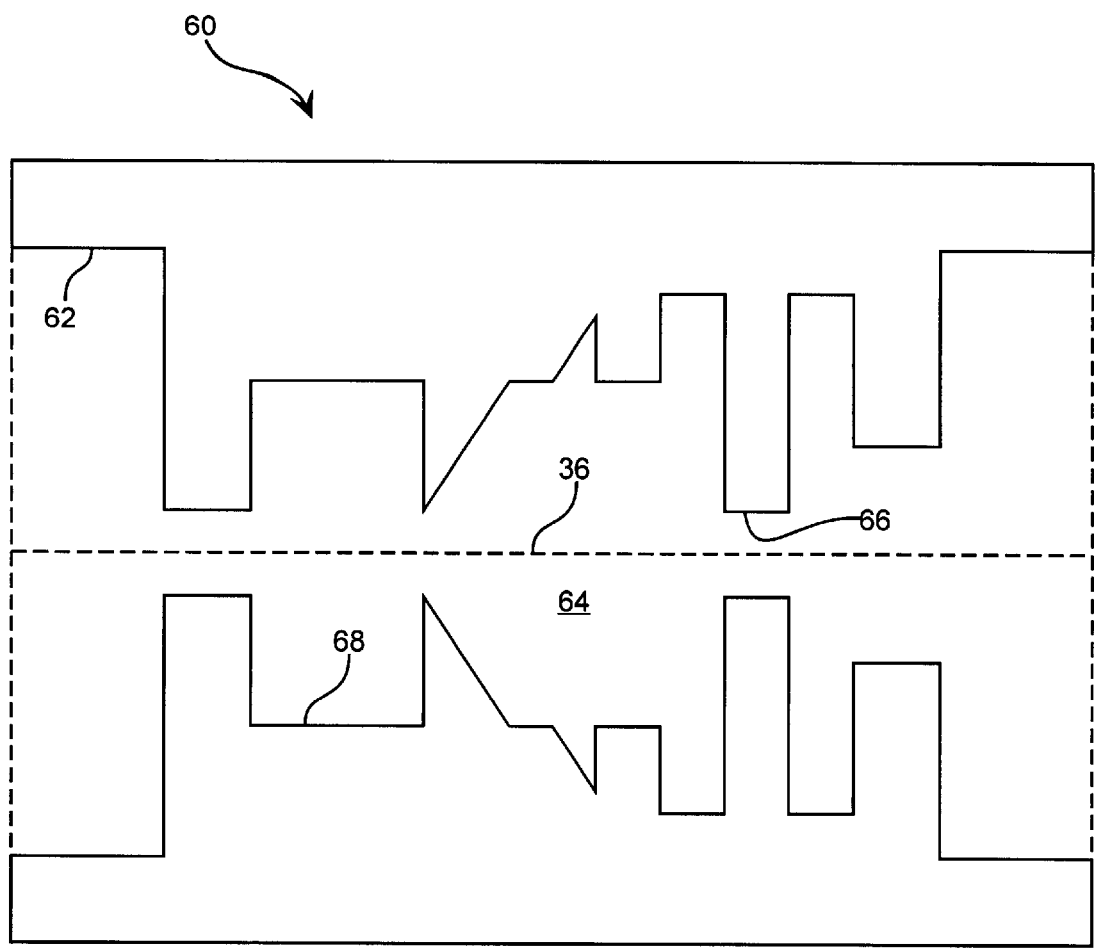

In summary, FIGS. 4–6 show the sequence of steps comprising coating the contoured sacrificial PMMA mandrel with the thin precursor plating base, electroplating a thick deposit around the PMMA mandrel, machining the outside and ends of the electroplated deposit, and dissolving out the PMMA mandrel, leaving a hollow, uniaxial microdevice 60 with high aspect ratio interior surface features, such as an annular ridge 66 or an annular recess 68, and submicrometer surface roughness.

Figure 7:
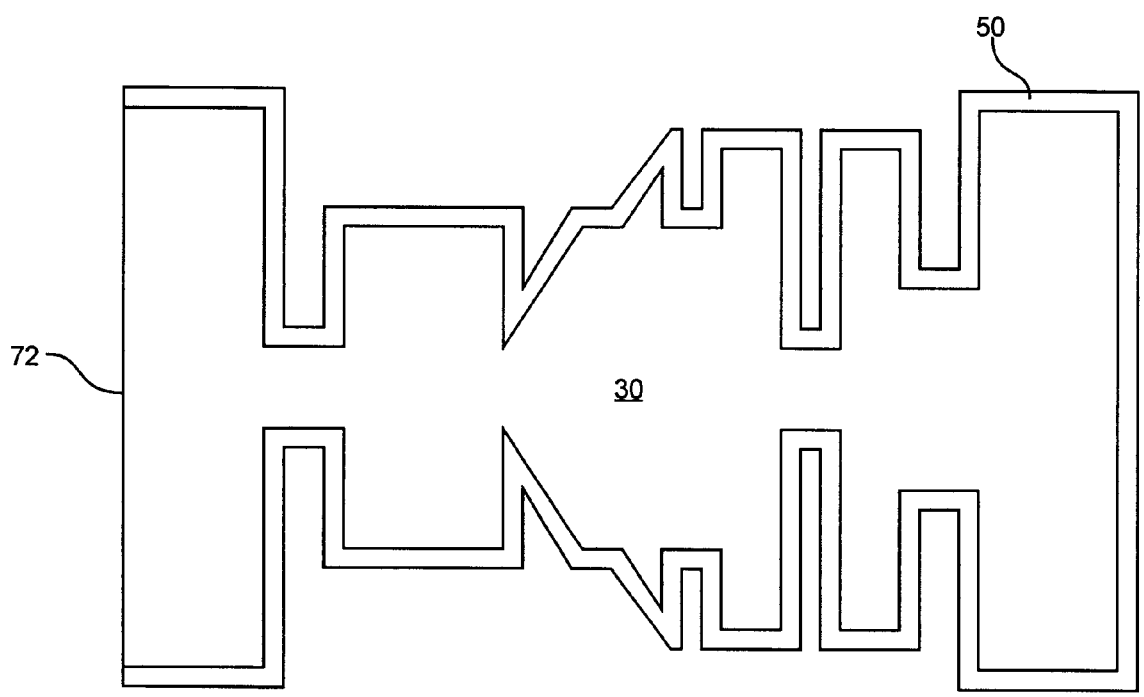
FIGS. 7–8 show the method by which a microdevice having flexible thin walls is produced using the sacrificial mandrel shown in FIG. 3.
Figure 8:
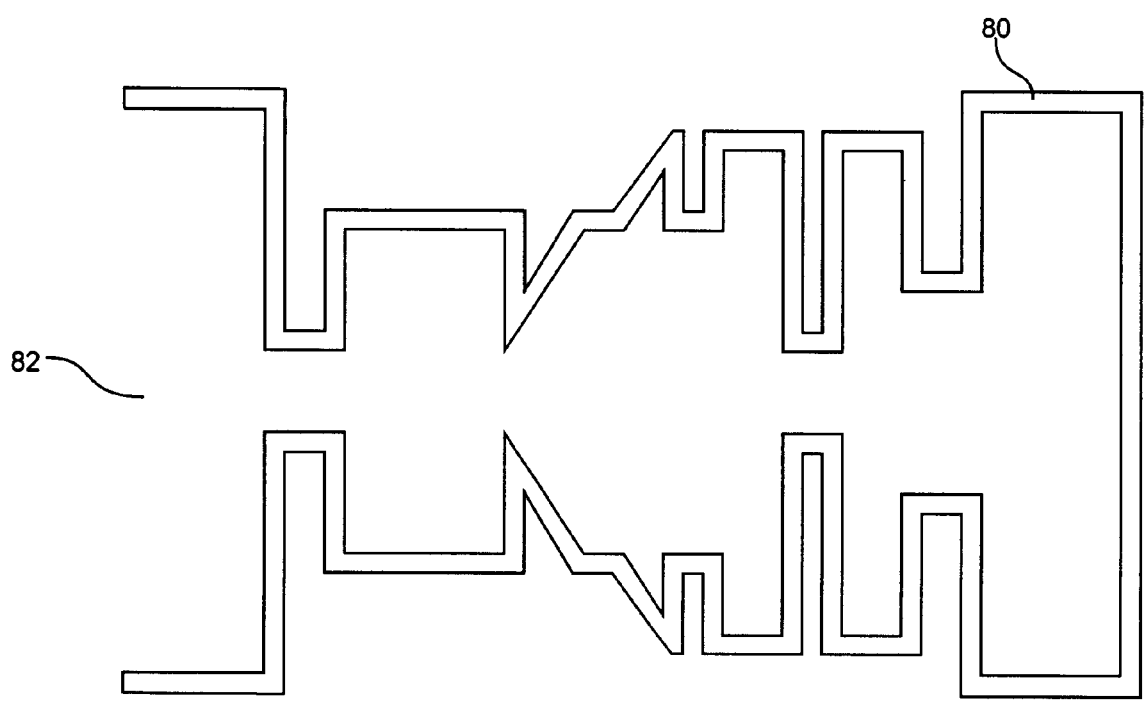

FIGS. 7–8 show the sequence of steps necessary to produce a thin-walled microdevice by this method. In this embodiment, the structural material is electroplated to a thin, uniform thickness coating 50 on the contoured sacrificial mandrel 30, as shown in FIG. 7. FIG. 7 also shows that a portion 72 of the mandrel is not coated to allow for removal of the sacrificial mandrel 30. FIG. 8 shows that the mandrel is subsequently removed to leave a free-standing, thin-walled microdevice 80 having an opening 82. Such a method may be used to produce a microbellows having accordian-style, flexible thin walls.

It will be understood that the above description is merely illustrative of applications of the principles of this invention and many other embodiments and modifications can be made by those of skill in the art without departing from the spirit and scope of the invention as defined in the claims. For example, the conducting layer does not have to be deposited in any particular thickness or contain any specific element such as chromium; any conducting material of sufficient thickness may be used.

All patents, patent applications, and publications mentioned herein are hereby incorporated by reference in their entireties.

What is claimed is:

1. A method of fabricating a microdevice having an interior cavity with at least one micrometer-size interior surface feature, comprising the steps of:
    (a) providing a shaped bit having a desired surface contour with at least one one micrometer-size surface feature;
    (b) rotating a sacrificial mandrel about a mandrel axis in a precision turning machine;
    (c) coating the sacrificial mandrel with a polishing compound;
    (d) polishing a surface of the rotating mandrel with the contoured surface of the to shaped bit so as to form a contoured sacrificial mandrel exhibiting a desired surface pattern corresponding to a inverse of the contoured surface of the bit;
    (e) coating the contoured sacrificial mandrel with a conformal structural material; and
    (f) removing the mandrel from the structural material.

2. The method of claim 1, wherein the polishing compound is comprised of a particulate composition.

3. The method of claim 2, wherein the polishing compound comprises particles having a size range of less than approximately 100 microns.

4. The method of claim 1, wherein the shaped bit is produced by a LIGA process.

5. The method of claim 1, wherein the shaped bit is metallic.

6. The method of claim 1, wherein the shaped bit is ceramic.

7. The method of claim 1, wherein the sacrificial mandrel is comprised of a polymeric material.

8. The method of claim 7, wherein the polymeric material is polymethylmethacrylate.

9. The method of claim 1, wherein step (f) is conducted by application of heat.

10. The method of claim 1, wherein step (f) is conducted by use of a polymer-degrading chemical agent.

11. The method of claim 10, wherein the chemical agent is an organic solvent.

12. The method of claim 1, wherein the sacrificial mandrel is comprised of a metal, glass, or ceramic.

13. The method of claim 1, wherein step (f) is conducted by use of an acid or base.

14. The method of claim 1, wherein the micrometer-sized feature on the shaped bit is a protrusion, whereby the corresponding micrometer-sized interior surface feature of the microdevice cavity is an axially symmetric annular ridge.

15. The method of claim 1, wherein the at least one micrometer-sized feature on the shaped bit is a recess, whereby the corresponding micrometer-size interior surface feature of the microdevice cavity is an axially symmetric annular recess.

16. The method of claim 1, further comprising, after step (d), shaping the sacrificial mandrel into a desired form.

17. The method of claim 1, further comprising repeating step (e) one or more times prior to carrying out step (f).

18. The method of claim 1, wherein step (e) is carried out by electroplating, plasma spraying, or vapor depositing the conformal structural material onto the contoured sacrificial mandrel.

19. The method of claim 1, wherein step (e) is carried out by (i) coating the sacrificial mandrel with a plating base comprised of a first metallic layer, followed by (ii) electroplating a second metallic layer on the plating base.

20. The method of claim 1, further comprising, after step (e), machining an outside surface of the structural material prior to step (f).

* * * * *